United States Patent [19]

Yamada et al.

[11] Patent Number: 4,520,462
[45] Date of Patent: May 28, 1985

[54] SEMICONDUCTOR MEMORY DEVICE

[75] Inventors: Katuyuki Yamada, Kawasaki; Kazuhiro Toyoda, Yokohama, both of Japan

[73] Assignee: Fujitsu Limited, Kawasaki, Japan

[21] Appl. No.: 449,768

[22] Filed: Dec. 14, 1982

[30] Foreign Application Priority Data

Dec. 18, 1981 [JP] Japan .................. 56-203364

[51] Int. Cl.³ .............................. G11C 11/40
[52] U.S. Cl. ........................ 365/189; 365/203
[58] Field of Search ............ 365/174, 175, 189, 203, 365/230

[56] References Cited

U.S. PATENT DOCUMENTS 4,442,509 4/1984 Herndon ..................... 365/175

FOREIGN PATENT DOCUMENTS 53-41968 4/1978 Japan .

Primary Examiner—Terrell W. Fears
Attorney, Agent, or Firm—Staas & Halsey

[57] ABSTRACT

A semiconductor memory device in which a holding current continuously flows from word selection lines through memory cells to hold lines. Current mirror circuits are placed at the base of each of the transistors which switch discharge currents on and off in the word line discharge circuits. Thus, the discharge circuit is independent of the effects of the operation of other discharge circuits and the word line discharge circuit is less affected by power source fluctuations. This allows a semiconductor memory device having a high access speed.

9 Claims, 5 Drawing Figures

SEMICONDUCTOR MEMORY DEVICE

BACKGROUND OF THE INVENTION (1) Field of the Invention

The present invention relates to a static-type semiconductor memory device in which the falling characteristic of the word selection line (word line) potential when the word line is transferred from the word selecting state to the word non-selecting state is improved.

(2) Description of the Prior Art

To keep the electric power consumption from rising along with the increasingly larger scale of semiconductor memory devices using bipolar random access memories (RAM), proposals have been made to reduce the holding current of the memory cells. A reduced holding current, however, results in slower falling time of the word line potential from the selecting state to the non-selecting state, therefore, obstructing high-speed memory operation.

To prevent the slowdown of the falling time of the word line potential, use has hitherto been made of the devices shown in FIGS. 1 or 2, indicated in the "Brief Description of the Drawings".

The device shown in FIG. 1 is disclosed in Japanese Unexamined Patent Publication (Kokai) No. 53-41968(1978). In FIG. 1, MC is a flip-flop type memory cell, WL is a word line, HL is a hold line, forming a pair with the word line WL, B and $\bar{B}$ are a pair of bit lines, WD is a word driver, and $I_H$ is a holding current source. The memory cells MC are arranged in a matrix and form a memory-cell array. A memory cell MC is selected by turning on one of the word drivers WD and one of the bit drivers (not shown). In FIG. 1, the memory array is partially abbreviated using broken lines to simplify the drawing.

A word line discharge circuit 1 which improves the delay characteristic of the falling time of the potential when the word line WL turns from the selecting state to the non-selecting state is arranged for each word line WL. When one of the word lines WL is selected and is of a high potential, both transistors 11 and 12 belonging to the word line discharge circuit 1 and connected to the selected word line WL turn on and are in a conductive state. Then, the current $I_{DIS}$ flows through the transistor 12, making the total electric current through the memory cells connected to the concerned word line WL equal to the holding current and the current $I_{DIS}$. The addition of the discharge current $I_{DIS}$ to the holding current when the word line is turned from the selecting state, to the non-selecting state eliminates the delay of the falling time from the high level to the low level at the word line. The discharge circuit used in this device has the merit of allowing amount of the discharge current $I_{DIS}$ to be determined independent of the operation of other word line circuits. The discharge circuit, however, has the problem of a greater possibility of an operation error due to fluctuations of the power source voltage $V_{cc}$.

The device shown in FIG. 2 was disclosed in Japanese Unexamined Patent Publication No. 56-37884 (1981). The circuit of the device is the same as the circuit of the device in FIG. 1, except for the discharge circuit 2. In the discharge circuit 2 of this device, when the word line WL is driven to a high level, a transistor 21 enters the conductive state, thus the base of a transistor 22 rises to a high level. The transistor 22 then enters the conductive state and the discharge current flows from the constant current source. The addition of the discharge current to the holding current in the selecting state of the word line, improves the delay characteristics of the falling time of the word line potential at the moment the change from the selecting state occurs, to non-selecting state as in the device of FIG. 1. In this circuit, there is no problem of an operation error due to fluctuations of the power source voltage. Since the emitter circuits of the transistors 22, one of which is located at each hold line, are connected together to one constant current source, the operating conditions differ along with the characteristics of the individual transistors 22, particularly the value of $h_{FE}$. Therefore there is a problem in that the transistor 22 for the selected word line does not always enter the conductive state alone.

SUMMARY OF THE INVENTION

An object of the present invention is to provide a semiconductor memory device wherein the discharge circuit is independent of the effect of the operation of other discharge circuits and wherein the word line discharge circuit is less affected by power source fluctuations. This is done by using a current mirror circuit as the base circuit of the transistor which switches the discharge current on and off, whereby a semiconductor memory device with high speed access time is obtained.

According to an aspect of the present invention, there is provided a semiconductor memory device of the static type in which a holding current continuously flows from the word selection lines through the memory cells to the hold lines. The device comprises, in each word selection line, a first transistor for detecting the potential charge on the word selection line; a delay circuit for delaying the output of the first transistor during a predetermined time; a second transistor, turned on and off by the output of the delay circuit, located between the hold line and the return line of the power source and operating as an electric current switch; a current mirror circuit having an output connected to the base of the second transistor; and a resistor connected between an input of the current mirror circuit and power source line.

DESCRIPTION OF THE PREFERRED EMBODIMENTS

Figure 1:
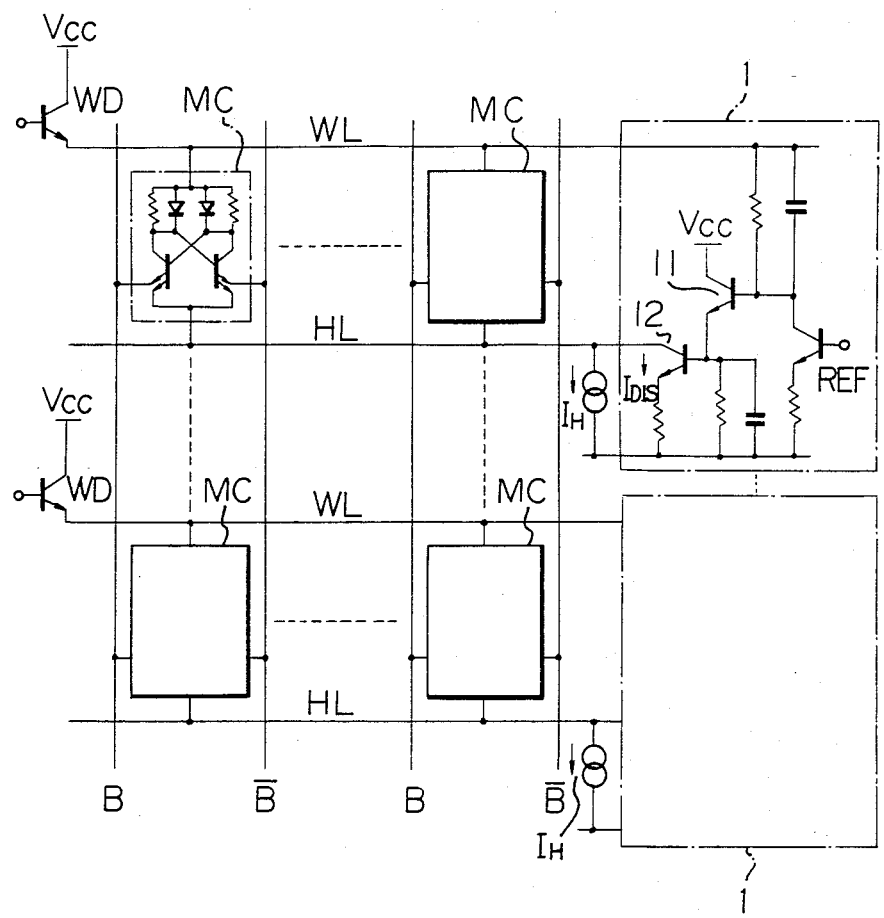
FIGS. 1 and 2 are circuit diagrams of prior art semiconductor memory devices.
Figure 3:
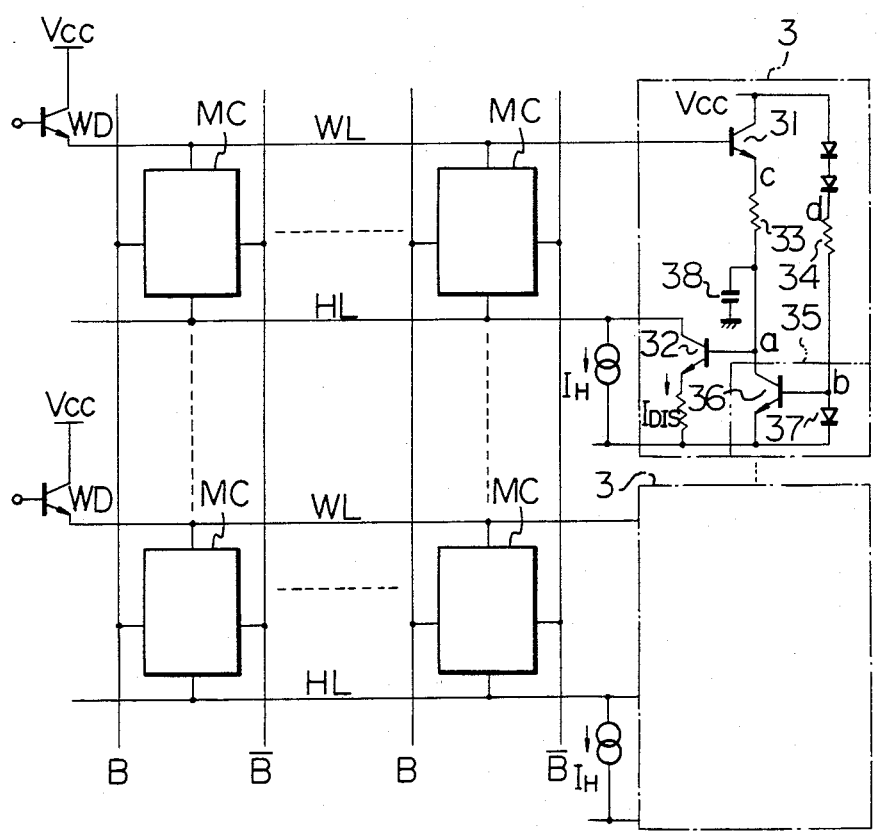
FIG. 3 is a circuit diagram of a semiconductor memory device according to a first embodiment of the present invention.

In FIG. 3, a circuit diagram of a semiconductor memory device according to a first embodiment of the present invention is shown. This device comprises memory cells MC arranged in a matrix, word drivers WD, holding current sources $I_H$ which are constant current power sources for holding the current in the memory cells, and word line discharge circuits 3. The circuit in the memory cell MC is the same as the circuit in the memory cell MC of FIG. 1, therefore, illustration of the inside of the memory cell block is omitted.

Each memory cell MC is connected by the word lines WL and the hold lines HL in the line direction and by pairs of bit lines B and $\overline{B}$ in the column direction. The output of the word driver WD is supplied to the word line WL, and the hold line HL is connected to the holding current source $I_H$. The word line discharge circuit 3 comprises a first transistor 31, a second transistor 32, a first resistor 33, a second resistor 34, and a current mirror circuit 35. The current mirror circuit 35 consists of a transistor 36 and a diode 37. The word line WL is connected to the base of the transistor 31 and the collector of the transistor 31 is connected to the power source $V_{cc}$. The emitter of the transistor 31 is connected to the base of the transistor 32, and the collector of the transistor 36 through the resistor 33. The base of the transistor 32 is grounded through a capacitor 38. The collector of the transistor 32 is connected to the hold line HL, and the emitter of the transistor 32 is connected to the return terminal of the power source $V_{cc}$ through a resistor. The emitter of the transistor 36 is connected to the return terminal of the power source $V_{cc}$. The connection line from the base of the transistor 36 is branched in two places, first, the base of the transistor 36 is connected to the power source $V_{cc}$ through the resistor 34 and diodes and, second, the base of the transistor 36 is connected to the return terminal of the power source $V_{cc}$ through the diode 37.

Below, the operation of the above-mentioned device is explained. One of the memory cells MC is selected by turning on one of the word drivers WD and one of the bit drivers (not shown). The word line WL which connects the selected memory cell MC becomes a high level, thus the base of the transistor 31 in the word line discharge circuit 3 receives a high level. Since the transistor 31 is in a conductive state and the voltage of the base of the transistor 32 rises to a higher level, the transistor 32 also enters a conductive state. This results in the addition of the current $I_{DIS}$ through the transistor 32 to the current which passes through the memory cells MC from the holding current source $I_H$ when the word line WL is not selected. This, as mentioned above, improves the delay characteristics of the falling time of the word line potential, when the word line WL turns from the selected state to the non-selected state.

Figure 2:
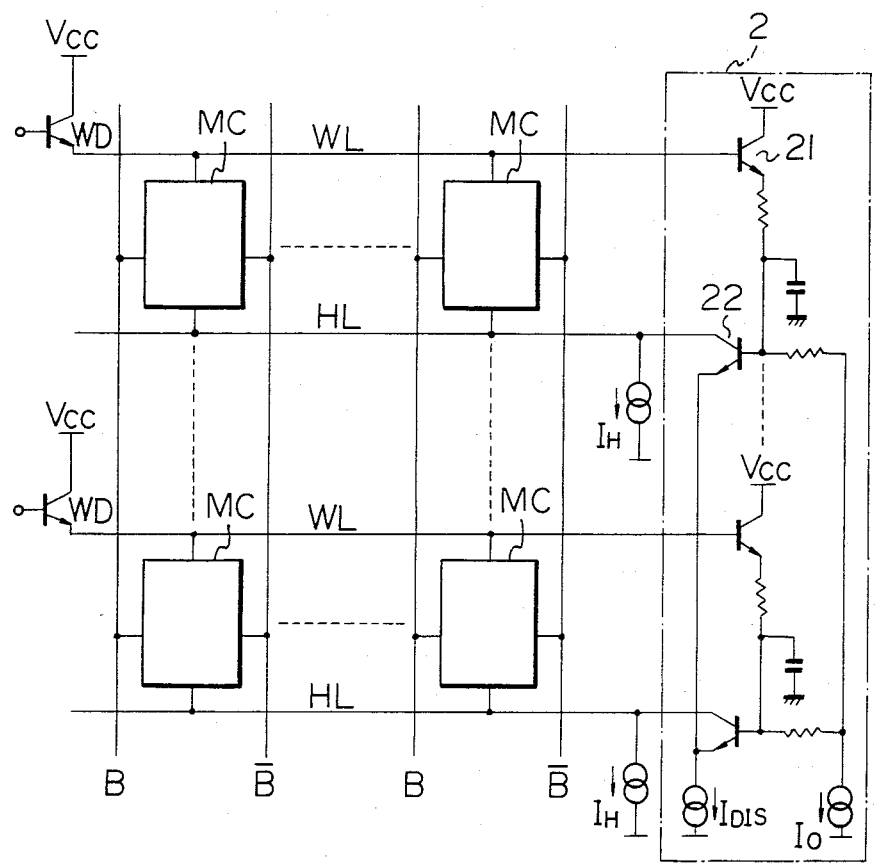

Below, the word line discharge circuit 3 is explained in detail. Since in this circuit, the emitters of each transistor are not connected together, as in the above-mentioned circuit of FIG. 2, each word line WL is an independent circuit and is not affected by the operation of other circuits. Also, the potential of a point (point a) connected to the base of the transistor 32 can remain at a constant value in spite of fluctuations of the power source voltage $V_{cc}$ by using the current mirror circuit 35. Therefore, the discharge current $I_{DIS}$ is not affected by fluctuations of the power source voltage $V_{cc}$.

Assuming that a point connected to the base of the transistor 36 is point b, a point connected to the emitter of the transistor 31 is point c, and a point connected to a terminal of the resistor 34 at the side of the power source $V_{cc}$ is point d, the potential difference among these points is as follows.

If the potential difference between the point c and the point a is $V_{ca}$, the resistance value of the resistor 33 is R1, the electric current passing through the resistor 33 is i1, the resistance value of the resistor 34 is R2, and the electric current passing through the resistor 34 is i2, then:

$$V_{ca} = i1 \cdot R1.$$

If the potential difference between the point d and point b is $V_{db}$ and the forward voltage drop of the diode is $V_F$, then:

$$V_{db} = i2 \cdot R2 = V_{cc} - 3V_F.$$

In the current mirror circuit, since i2/i1 is constant, $$\frac{V_{db}}{V_{ca}} = \frac{i2 \cdot R2}{i1 \cdot R1}$$

is constant and $$V_{ca} = \frac{V_{db} \cdot i1 \cdot R1}{i2 \cdot R2}.$$

If the potential of the point a is Va and the forward voltage drop between the base and the emitter of the transistor is $V_{BE}$, then:

$$V_a = V_{cc} - 2V_{BE} - V_{ca}.$$

$$= V_{cc} - 2V_{BE} - \frac{(V_{cc} - 3V_F) \cdot i1 \cdot R1}{i2 \cdot R2}$$

Thus, $\frac{dV_a}{dV_{cc}} = 1 - \frac{i1 \cdot R1}{i2 \cdot R2}.$

Accordingly, if (i1·R1/i2·R2)=1, the potential of the point a will not change due to fluctuations of $V_{cc}$. Thus, if the resistance values of the resistors R1 and R2, and the emitter areas (junction area) of the diode 37 and the transistor 36 are set so that the above equation is satisfied, the potential of the point a will not change due to fluctuations of $V_{cc}$.

In addition, the capacitor 38 connected to the base of the transistor 32 in the word line discharge circuit 3 delays the output signal of the transistor 31. This capacitor allows the discharge of the transistor 32 to be maintained after the word line WL enters the non-selecting state and the potential thereof becomes a low level.

Figure 4:
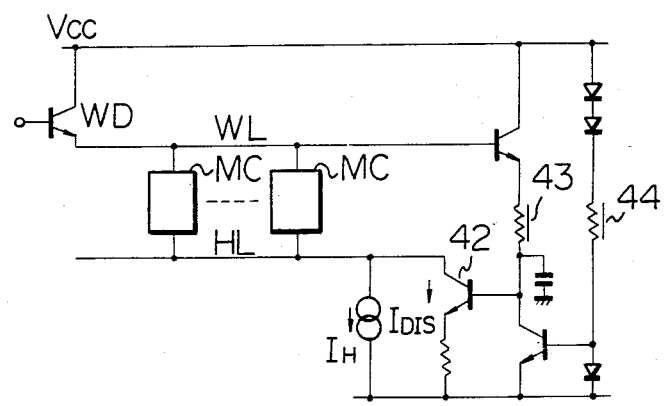
FIG. 4 is a partially abbreviated circuit diagram of a semiconductor memory device according to a second embodiment of the present invention.

FIG. 4 is a partial circuit diagram according to a second embodiment of the present invention. In the figure, one of the word line discharge circuits and the memory cells for the word line are shown. Other elements are omitted. In this embodiment, pinch resistors 43 and 44 are used instead of the resistors 33 and 34 of FIG. 3. The difference between this circuit and the circuit in FIG. 3 lies just in the above-mentioned portions. The resistance value of the pinch resistor is low when the $h_{FE}$ of the transistor, which is produced in the identical production process, is low and is high when the $h_{FE}$ of the transistor is high. Therefore, fluctuations of the base potential of the transistor 42 by the change of $h_{FE}$ of the transistor can be reduced.

An explanation of the pinch resistor is given in Japanese Patent Application No. 56-097385 by one of the inventors of the present invention.

Figure 5:
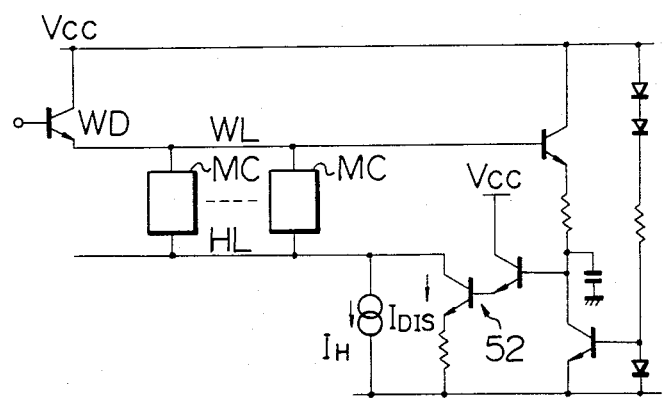
FIG. 5 is a partially abbreviated circuit diagram of a semiconductor memory device according to a third embodiment of the present invention.

FIG. 5 is a partial circuit diagram according to a third embodiment of the present invention. In the figure, one of the word line discharge circuits and relevant memory cells are shown. Other elements are omitted. In this embodiment, Darlington connected transistors 52 are used instead of the transistor 32 of FIG. 3. This is the only difference between the circuit of this embodiment and the circuit of FIG. 3. The use of Darlington connected transistors reduces the effect of changes of the $h_{FE}$ of the transistors.

We claim:

1. A static-type semiconductor memory device operatively connectable to a power source having a return line, in which a holding current continuously flows from word selection lines through memory cells to hold lines, said static-type semiconductor memory device comprising:
   a first transistor, operatively connected to one of the word selection lines, for detecting the potential charge on said one of the word selection lines and for outputting an output signal;
   a delay circuit, operatively connected to said first transistor, for delaying the output of said first transistor during a predetermined time and for outputting a delayed output signal;
   a second transistor, having a base, operatively connected to said delay circuit and disposed between one of the hold lines and the return line of the power source, said second transistor turned on and off by the delayed output signal of said delay circuit to operate as an electric current switch;
   a current mirror circuit operatively connected to the base of said second transistor and having an input; and
   a first resistor operatively connected between the input of said current mirror circuit and the return line of the power source.

2. A semiconductor memory device as defined in claim 1, wherein said delay circuit comprises:
   a second resistor operatively connected to said first transistor; and
   a capacitor operatively connected to said second resistor.

3. A semiconductor memory device as defined in claim 2, wherein said first and second resistors are pinch resistors produced in an identical process with said second transistor.

4. A semiconductor memory device as defined in claim 1, 2, or 3, wherein said second transistor comprises Darlington connected transistors.

5. A semiconductor memory device as defined in claim 1, 2, or 3, wherein said current mirror circuit consists of a third transistor and a diode connected between the base and emitter of said third transistor.

6. A semiconductor memory device as defined in claim 4, wherein said current mirror circuit comprises:
   a third transistor operatively connected to said second transistor and having a base and emitter; and
   a diode operatively connected between the base and emitter of said third transistor.

7. A word line discharging circuit for a semiconductor memory device having word lines and hold lines and operatively connectable to a power source, comprising:
   a first transistor operatively connected to one of the word lines and the power source;
   a delay circuit operatively connected to said first transistor;
   a second transistor operatively connected to said delay circuit;
   a current mirror switch operatively connected to said second transistor; and
   a first resistor operatively connected between said current mirror switch and the power source.

8. A word line discharging circuit as defined in claim 7, wherein said current mirror switch comprises:
   a third transistor operatively connected to said second transistor; and
   a diode operatively connected to said third transistor forming a connection node therebetween, said first resistor operatively connected to the connection node.

9. A word line discharging circuit as defined in claim 7, wherein said delay circuit comprises:
   a second resistor operatively connected between said first and second transistors; and
   a capacitor operatively connected to said second resistor.

* * * * *